United States Patent
Soss et al.

(10) Patent No.: US 11,004,509 B1
(45) Date of Patent: May 11, 2021

(54) CIRCUIT STRUCTURE AND MEMORY CIRCUIT WITH RESISTIVE MEMORY ELEMENTS, AND RELATED METHODS

(71) Applicant: GLOBALFOUNDRIES U.S. Inc., Santa Clara, CA (US)

(72) Inventors: Steven R. Soss, Saratoga Springs, NY (US); Bipul C. Paul, Mechanicville, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/677,790

(22) Filed: Nov. 8, 2019

(51) Int. Cl.
  *G11C 13/00* (2006.01)
  *H01L 27/24* (2006.01)
(52) U.S. Cl.
  CPC ........ *G11C 13/004* (2013.01); *G11C 13/0026* (2013.01); *G11C 13/0069* (2013.01); *H01L 27/2436* (2013.01); *H01L 27/2463* (2013.01); *G11C 2013/0045* (2013.01); *G11C 2013/0078* (2013.01); *G11C 2213/79* (2013.01)
(58) Field of Classification Search
  CPC ................................................. G11C 13/0002
  USPC ......................................................... 365/148
  See application file for complete search history.

(56) References Cited

U.S. PATENT DOCUMENTS

| | | | |
|---|---|---|---|
| 8,233,309 B2* | 7/2012 | Fasoli | G11C 13/003 365/148 |
| 9,147,836 B2 | 9/2015 | Greene et al. | |
| 9,153,316 B1 | 10/2015 | Ryu | |
| 9,704,576 B2 | 7/2017 | Best et al. | |
| 2010/0091549 A1 | 4/2010 | Lee et al. | |
| 2012/0075910 A1* | 3/2012 | Yasuda | G11C 13/0069 365/148 |
| 2014/0185357 A1* | 7/2014 | Barabash | G11C 13/0002 365/148 |
| 2016/0259676 A1* | 9/2016 | Tomishima | G06F 11/1076 |
| 2018/0083634 A1* | 3/2018 | McCollum | H01L 45/12 |
| 2018/0331115 A1* | 11/2018 | Portal | H01L 27/2472 |
| 2019/0013063 A1* | 1/2019 | Liu | G11C 11/412 |
| 2020/0161373 A1* | 5/2020 | Cheng | G11C 13/0026 |
| 2020/0194669 A1* | 6/2020 | Jang | H01L 45/14 |

* cited by examiner

*Primary Examiner* — Min Huang
(74) *Attorney, Agent, or Firm* — Yee Tze Lim; Hoffman Warnick LLC

(57) ABSTRACT

The disclosure provides a circuit structure for storage and retrieval of data, and related methods. The circuit structure may include drive transistor having a source terminal, a drain terminal, and a gate terminal coupled to a word line. A first resistive memory element coupled between the source terminal of the drive transistor and a first bit line may be in a first memory state. A second resistive memory element coupled between the drain terminal of the drive transistor and a second bit line may be in a second memory state opposite the first memory state. The structure may also include a read transistor having a source terminal coupled to the drain terminal of the drive transistor, a drain terminal coupled to ground, and a gate terminal coupled to a select line.

19 Claims, 5 Drawing Sheets ial memory elements, and related methods. Various embodiments of the disclosure include resistive memory elements in opposite memory states, and features for reading and writing data using the resistive memory elements.

CIRCUIT STRUCTURE AND MEMORY CIRCUIT WITH RESISTIVE MEMORY ELEMENTS, AND RELATED METHODS

TECHNICAL FIELD

Embodiments of the disclosure relate generally to circuit structures and memory circuits with resistive memory elements, and related methods. Various embodiments of the disclosure include resistive memory elements in opposite memory states, and features for reading and writing data using the resistive memory elements.

BACKGROUND

Resistive random access memory (ReRAM) is an emerging and appealing sector of digital memory technology. ReRAM technology may use programmable elements of variable resistance to indicate high and low voltages. Data can be entered into resistive memory elements by changing their electrical resistance, and data can be read from the resistive memory elements by measuring a voltage drop across the element after it is programmed. Resistive memory elements may include, e.g., a two-terminal electrical pathway formed by two conductive terminals separated by a thin layer of dielectric material. Resistive memory elements fall into two basic categories based on the conduction filament being formed; either through the diffusion of a conducting species (typically referred to as a conductive bridge, or CBRAM), or through the formation and passivation of oxygen vacancies (typically referred to as OxRAM). Depending on the direction of current flows across the dielectric material from one terminal to the other, the current may cause ions to form within the dielectric alongside one of the terminals. This formation/disruption may substantially decrease/increase the electrical resistance across the resistive memory element. A technical challenge associated with the use of resistive memory elements is controlling the current spike which is created when the resistive element changes state, especially from a high resistance to low resistance. The current spikes caused by reprogramming a resistive memory element, in some circumstances, may endanger the operation of the resistive element itself and/or other elements in the same circuit structure.

SUMMARY

A first aspect of the present disclosure provides a circuit structure including: a drive transistor having a source terminal, a drain terminal, and a gate terminal coupled to a word line; a first resistive memory element coupled between the source terminal of the drive transistor and a first bit line, wherein the first resistive memory element is in a first memory state; a second resistive memory element coupled between the drain terminal of the drive transistor and a second bit line, wherein the second resistive memory element is in a second memory state opposite the first memory state; and a read transistor having a source terminal coupled to the drain terminal of the drive transistor, a drain terminal coupled to ground, and a gate terminal coupled to a select line.

A second aspect of the present disclosure provides a memory circuit, including: a control circuit coupled to a plurality of word lines and a plurality of select lines; and a plurality of memory cells each coupled to one of the plurality of select lines and one of the plurality of select lines, wherein each of the plurality of memory cells includes: a drive transistor having a source terminal, a drain terminal, and a gate terminal coupled to one of the plurality of word lines, a first resistive memory element coupled between the source terminal of the drive transistor and a first bit line, wherein the first resistive memory element is in a first memory state; a second resistive memory element coupled between the drain terminal of the drive transistor and a second bit line, wherein the second resistive memory element is in a second memory state opposite the first memory state, and a read transistor having a source terminal coupled to the drain terminal of the drive transistor, a drain terminal coupled to ground, and a gate terminal coupled to one of the plurality of select lines.

A third aspect of the present disclosure provides a method for storing electronic data, the method including: providing a structure including: a drive transistor having a source terminal, a drain terminal, and a gate terminal coupled to a word line, a first resistive memory element coupled between the source terminal of the drive transistor and a first bit line, wherein the first resistive memory element is in a first memory state; a second resistive memory element coupled between the drain terminal of the drive transistor and a second bit line, wherein the second resistive memory element is in a second memory state opposite the first memory state; and a read transistor having a source terminal coupled to the drain terminal of the drive transistor, a drain terminal coupled to ground, and a gate terminal coupled to a select line; disabling current flow across the read transistor; enabling current flow across the drive transistor; and transmitting a write current from the first bit line to the second bit line through the first resistive memory element, the drive transistor, and the second resistive memory element, wherein transmitting the write current causes the first resistive memory element to switch to the second memory state, and causes the second memory element to switch to the first memory state.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
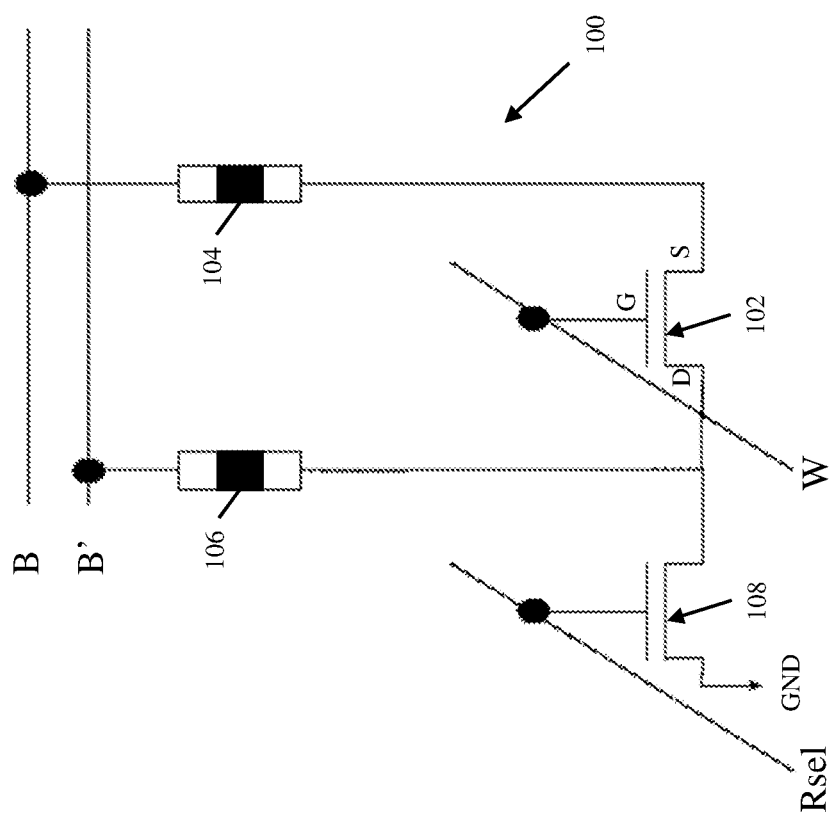
FIG. 1 shows a schematic view of a circuit structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure pertain to a circuit structure and memory circuit for implementing resistive random access memory ("ReRAM") and related methods for storing electronic data. RAM is a critical element for the operation of integrated circuit (IC) technology. RAM refers to any type of memory cell which is designed to store data temporarily. RAM may take a variety of forms, including static RAM ("SRAM") or dynamic RAM ("DRAM"). RAM may be implemented using a wide variety of circuit structures, electronic elements, and/or device architectures. The components of RAM provide a memory cell capable of electronically storing data in the form of a binary digit, i.e., a recorded high or low voltage to implement various types of logic. During operation, the memory cells in RAM must be configured for ease of writing information (i.e., storing high and low voltages) and reading information (i.e., identifying the stored voltage in a given cell).

ReRAM may be formed by using resistive memory elements such as memristors and/or other variable resistors whose resistance may change from high or low values upon experiencing a threshold electrical current. Resistive memory elements may include, e.g., a two-terminal electrical pathway formed by two conductive terminals separated by a thin layer of dielectric material. As current flows across the dielectric material from one terminal to the other, the current may cause ions to form within the dielectric alongside one of the terminals and thus increase the resistance across the resistive memory element. Although ReRAM has emerged as a possible option for device reliability and speed, the inherent nature of resistive memory elements has imposed unique technical challenges to successfully implementing ReRAM. Embodiments of the disclosure provide a circuit structure and memory circuit with multiple resistive memory elements in opposite (high and low) resistance states. The memory state of the circuit may be determined by identifying which of the two resistive memory elements is high or low, rather than determining the resistive state of a single element.

Referring to FIG. 1, a circuit structure (hereinafter "structure") 100 according to embodiments of the disclosure is shown. Circuit structure 100 may be incorporated into one or more memory circuits of a device to implement read and write operations of memory, e.g., as described in further detail elsewhere herein. A write operation refers to changing the binary digit stored in a memory structure. A read operation refers to identifying the binary digit stored in a memory structure without changing it. Structure 100 may include a drive transistor 102 with three terminals: a source terminal S, a drain terminal D connected to source terminal S through a channel region of the transistor, and a gate terminal G for controlling the conductivity of the channel between source and drain terminals S, D. When at least a threshold voltage magnitude is applied to gate terminal G, electrical current may travel across a transistor between source and drain terminals S, D. Drive transistor 102 may be coupled to a word line W at gate terminal G, thereby allowing electrical signals (e.g., digital words) to selectively enable current flow across source and drain terminals S, D of drive transistor 102. In this manner, the voltage of word line W can control drive transistor 102 and hence the reading or writing of data in structure 100. According to an example, structure 100 may remain dormant (i.e., incapable of having data written to, or read from) when no voltage is applied to drive transistor 102 from word line W.

Structure 100 may include a first resistive memory element (hereinafter "first element") 104 coupled between source terminal S and a first bit line B. Structure 100 may also include a second resistive memory element (hereinafter "second element") 106 coupled between drain terminal D and a second bit line B'. The presence of two elements 104, 106 and two bit lines B, B' in structure 100 is a departure from conventional memory cell structures, which may include only a single bit line and single memory element therein. Each element 104, 106 may take the form of any currently-known or later developed structure for recording digital data by modifying the resistance of an electrical connection between two terminals.

In an illustrative embodiment, each element 104, 106 may be embodied as a metal-insulator-metal ("MIM") resistor. A MIM resistor refers to a structure which includes two portions of conductive material separated by a region of dielectric material. Such a device may operate by varying the resistance of the dielectric material. During operation, the dielectric material initially may be in a resistive state in which current flowing between the two portions of conductive material induces a significant voltage loss. However, the dielectric may be rendered conductive by forming a filament or conduction path by application of a sufficiently high voltage. The sufficiently high voltage may refer to any voltage level which causes metal ions and/or vacancies to form within the dielectric material proximate the portions of conductive material. The conduction path can arise from different mechanisms, including vacancy or metal defect migration. Once the conduction path is formed, it may be "reset" (i.e., restoring the initial high resistance) by another voltage. After being reset, the conduction path may be "set" (i.e., re-formed, restoring the lower resistance) by another voltage. In some instances, the multiple current paths may form in place of a single path or filament.

Embodiments of the structure 100 may include elements 104, 106 in opposite memory states, i.e., one of the two elements 104, 106 is set while the other is reset. As discussed elsewhere herein, the binary digit recorded in structure 100 may be changed by switching the memory state of each element 104, 106, while maintaining each element 104, 106 in complementary memory states. According to an example, element 104 being set and element 106 being reset may represent a binary digit of zero or a logic "low." In this case, structure 100 may record a binary digit of one or a logic "high" by changing element 104 to reset and element 106 to set. When one of the two elements 104, 106 is set while the other is reset, structure 100 may continue to function as a memory cell for implementing ReRAM. According to an example, the resistance differential between the set and reset memory states of elements 104, 106 may have an order of magnitude of, e.g., approximately one-thousand. In the reset memory state, element(s) 104, 106 may have a high resistance of approximately ten mega-ohms (Me). In the set memory state, element(s) 104, 106 may have a low resistance of approximately ten kilo-ohms (kΩ).

Structure 100 may also include a read transistor 108 configured for reading digital information recorded in structure 100. Read transistor 108 may be coupled at its gate to a select line Rsel for activating and deactivating read transistor 108 to implement read operations of structure 100. A source terminal of read transistor 108 may be coupled to a junction between second element 106 and drain terminal D of drive transistor 102. In alternative embodiments, a source or drain terminal of read transistor 108 may be coupled to the junction between source terminal S of drive transistor 102 and first element 104. In any case, the opposite terminal of read transistor 108 (e.g., the drain in an example embodiment) may be coupled to ground GND. To reduce the risk of incorrect readings during operation, the internal resistance between the source and drain terminals of read transistor 108 may be significantly less than the resistance differential between the first and second memory states of elements 104, 106. For instance, the internal resistance across read transistor may be one-hundred times less than the low resistance memory state of elements 104, 106, e.g., at most approximately 0.10 kΩ. During operation, read transistor 108 may selectively enable and disable an electrical pathway to ground through elements 104, 106 to determine which element(s) 104, 106 is/are set and reset.

At the time of manufacture, or in an initial state, elements 104, 106 may have identical (i.e., non-complementary) memory states. Embodiments of structure 100 discussed herein rely on elements 104, 106 being in opposite set and reset memory states to implement read and write operations for memory. Embodiments of the disclosure thus provide a methodology to induce the opposite (i.e., complementary) memory states in elements 104, 106. According to an example, such a method may include enabling current flow across read transistor 108 while disabling current flow across write transistor 102. Here, current from second element 106 is permitted to flow across read transistor 108 to ground GND without flowing to first element 104 through drive transistor 102. Applying a voltage to second bit line B' thus will induce a current flow solely through second element 106. The applied voltage and current flow may cause second element 106 to switch to the memory state that it is opposite its original configuration. The applied voltage and current flow will not have any effect on first element 104, due to the lack of an applied gate voltage to drive transistor 102. After applying the voltage solely to second element 106, second element 106 will have a memory state opposite to first element 104. Structure 100 thus may be rendered operable for reading and writing of data in a memory circuit as described herein. It is understood that first and second elements 104, 106 alternatively may be placed into opposite memory states by any conceivable method, e.g., modifications to manufacture and/or implementation of other processes for causing two resistive memory elements to be in opposite memory states.

Figure 2:
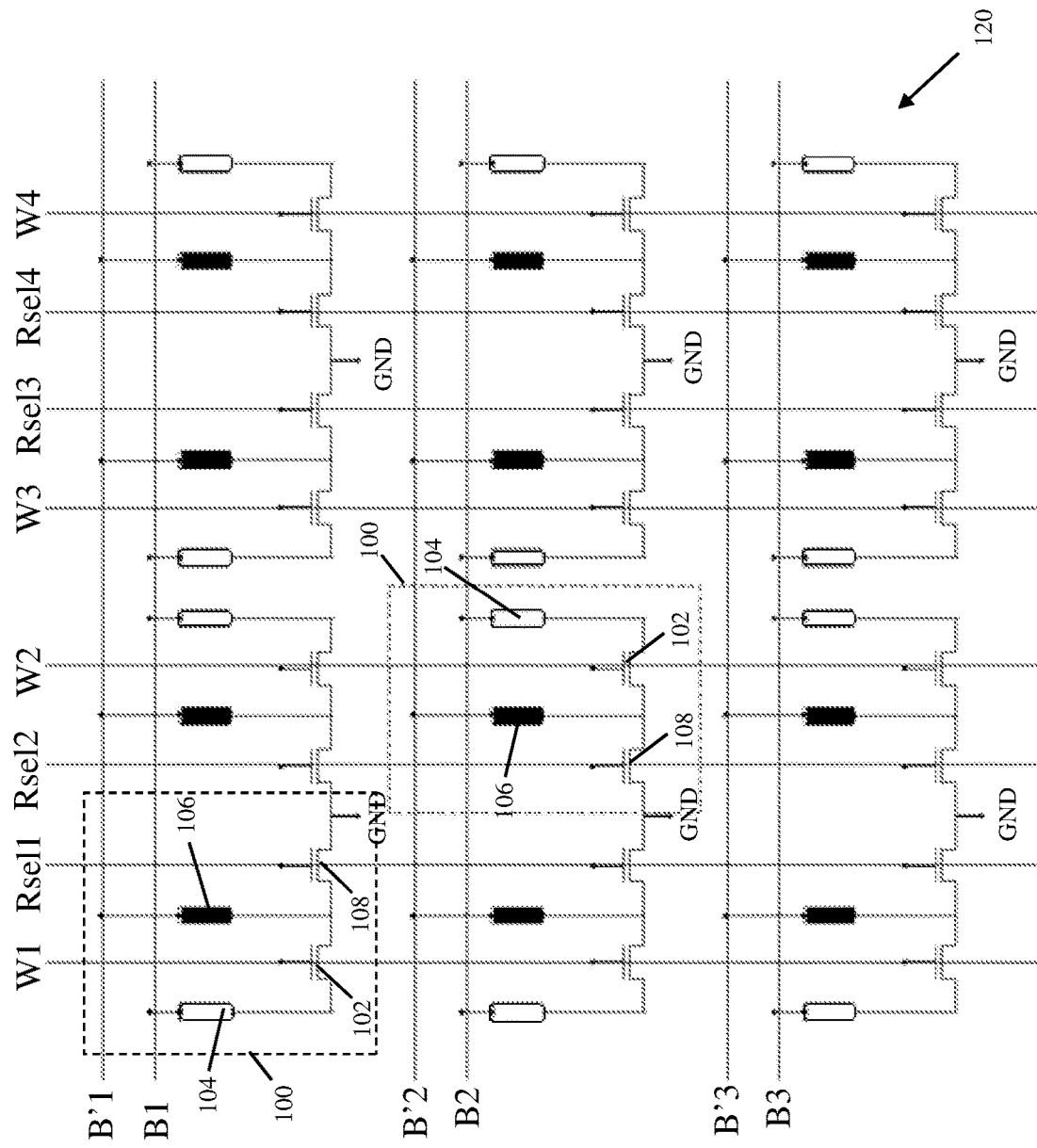
FIG. 2 shows a schematic view of a memory circuit according to embodiments of the disclosure.

Turning to FIG. 2, embodiments of the disclosure provide a memory circuit 120 which includes one or more units of structure 100 therein for recording and retrieving digital data. In some cases, memory circuit 120 may be a random access memory (RAM) cell for temporary storage and retrieval of data during the operation of a device. In a more specific example, memory circuit 120 may take the form of a ReRAM cell where each binary digit is stored or retrieved using an embodiment of structure 100. Memory circuit 120 may include a plurality of structures 100 each having a respective drive transistor 102, elements 104, 106, and read transistor 108. In some cases, it may be possible for one or more drive transistors 102 or read transistors 108 to be shared between multiple structures 100. Memory cell 120 may include multiple pairs of bit lines, identified separately as a first pair (B1, B'1), a second pair (B2, B'2), and a third pair (B3, B'3) of bit lines. It is understood that any desired number of bit lines may be included in further embodiments. Each pair of bit lines may be electrically coupled to elements 104, 106 of multiple structures. For example, first pair of bit lines B1, B'1 includes a first bit line B1 coupled to first element 104 of multiple structures 100, and a second bit line B'1 coupled to second element 106 of structures 100. Memory circuit 120 may also include multiple word lines (identified separately as W1, W2, W3, W4) and select lines (identified separately as Rsel1, Rsel2, Rsel3, Rsel4). The various word lines and select lines can be used to control whether a write or read operation occurs, and which structure(s) 100 will undergo writing or reading of data. As discussed herein, a combination of one or more control circuits and/or current sources may write data to, and read data from, selected structures of memory circuit 120.

Figure 3:
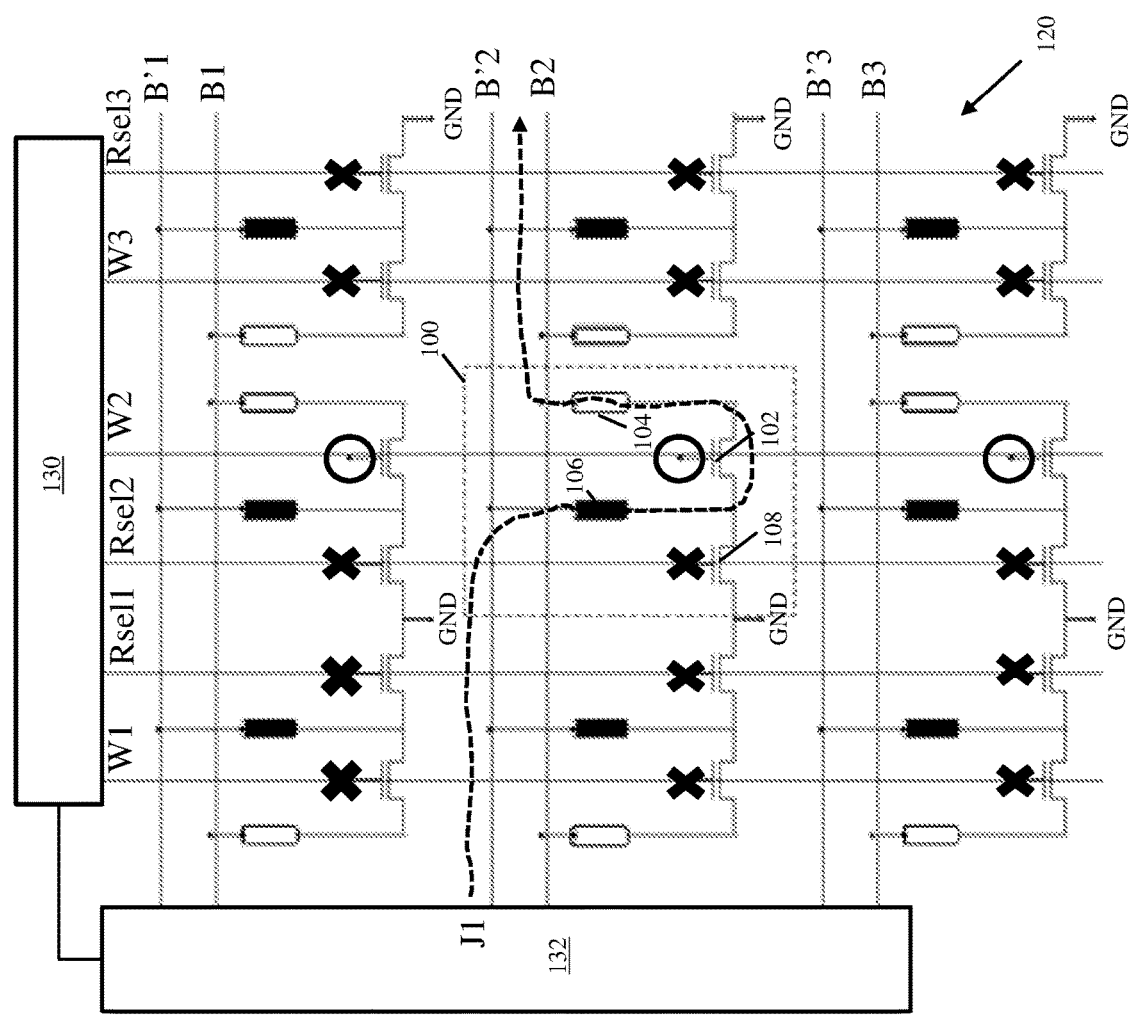
FIG. 3 shows a schematic view of the memory circuit during a write operation according to embodiments of the disclosure.

FIG. 3 depicts a selected structure 100 of memory circuit 120 undergoing a write operation according to embodiments of the disclosure. Memory circuit 120 may include a control circuit 130 electrically coupled to the gate terminal of drive transistor(s) 102 and read transistor(s) 108 of structure(s) 100. Control circuit 130 may selectively enable and disable current flow across transistor(s) 102, 108 of structure(s) 100 to implement reading and writing of data with structure(s) 100. Control circuit 120 in some cases may include a processor, memory, and other computing element to control the application of a gate voltage to transistor(s) 102, 108, the timing of such application, etc. In further embodiments, control circuit 130 may take the form of non-computing hardware capable of implementing commands relayed by one or more controllers and/or other devices external to memory circuit 120.

Memory circuit 120 may also include a current source 132 coupled to one or more pairs of bit lines (e.g., bit lines B1, B'1, and others as shown) to initiate read and/or write operations on selected structure(s) 100. Current source 132 may be coupled to control circuit 130 as shown, and in further embodiments may be an independent component and/or integrated with control circuit 130 into a larger control device and/or system. Current source 132 may be configured to transmit a current of between approximately one microampere (μA) and approximately ten μA for a reading or writing operation. Current source 132 may work together with control circuit 130 to read data from, or write data to, selected structure(s) by selectively enabling current flow across transistor(s) 102, 108 and directing current through a corresponding pair of bit lines.

FIG. 3 depicts a write operation being performed on one structure 100 of memory cell 120. In the accompanying FIGS., an "X" icon indicates transistor(s) 102, 108 without a gate voltage applied thereto, while an "0" icon indicates transistor(s) 102, 108 with a gate voltage applied thereto. Implementing a write operation with structure 100 may include applying a voltage to a selected word line (e.g., word line W2) without applying a voltage to the corresponding select line (Rsel2 in this example). In some cases, control circuit 130 may be configured to apply the selected voltages directly. Applying a voltage to a selected word line without applying the voltage to the corresponding select line can disable current flow across read transistor 108, and enable current flow across drive transistor 102, in one structure 100. Subsequently applying a write current J1 (e.g., using current source 132) to a selected bit line (e.g., B'2) will cause write current J1 to flow across elements 104, 106 to the other bit line (e.g., B2). Write current J1 may have a magnitude sufficient to shift elements 104, 106 from one memory state to the other, e.g., at least approximately one μA. In alternative embodiments, the applied current may flow in a reverse direction by being applied to the other bit line (e.g., B2) to flow to the opposite bit line (e.g., B'2). To prevent data in other structures 100 from being modified inadvertently, the disclosure may include disabling current flow through at least one other structure 100 and/or memory circuit 120 before applying write current J1 to the selected bit line(s).

During the write operation, each element 104, 106 of structure 100 will undergo a change in resistance, thereby inducing a change in memory while maintaining the complementary state of elements 104, 106. In an example implementation, element 104 being set and element 106 being reset may indicate a binary digit of zero. After a write operation, element 104 may switch to being reset and element 106 may switch to being set, and this new configuration may indicate a binary digit of one. By applying voltages to selected word lines, and a current through a selected pair of bit lines, an operator of memory circuit 120, control circuit 130, and/or current source 132 may write data to memory circuit 120.

Figure 4:
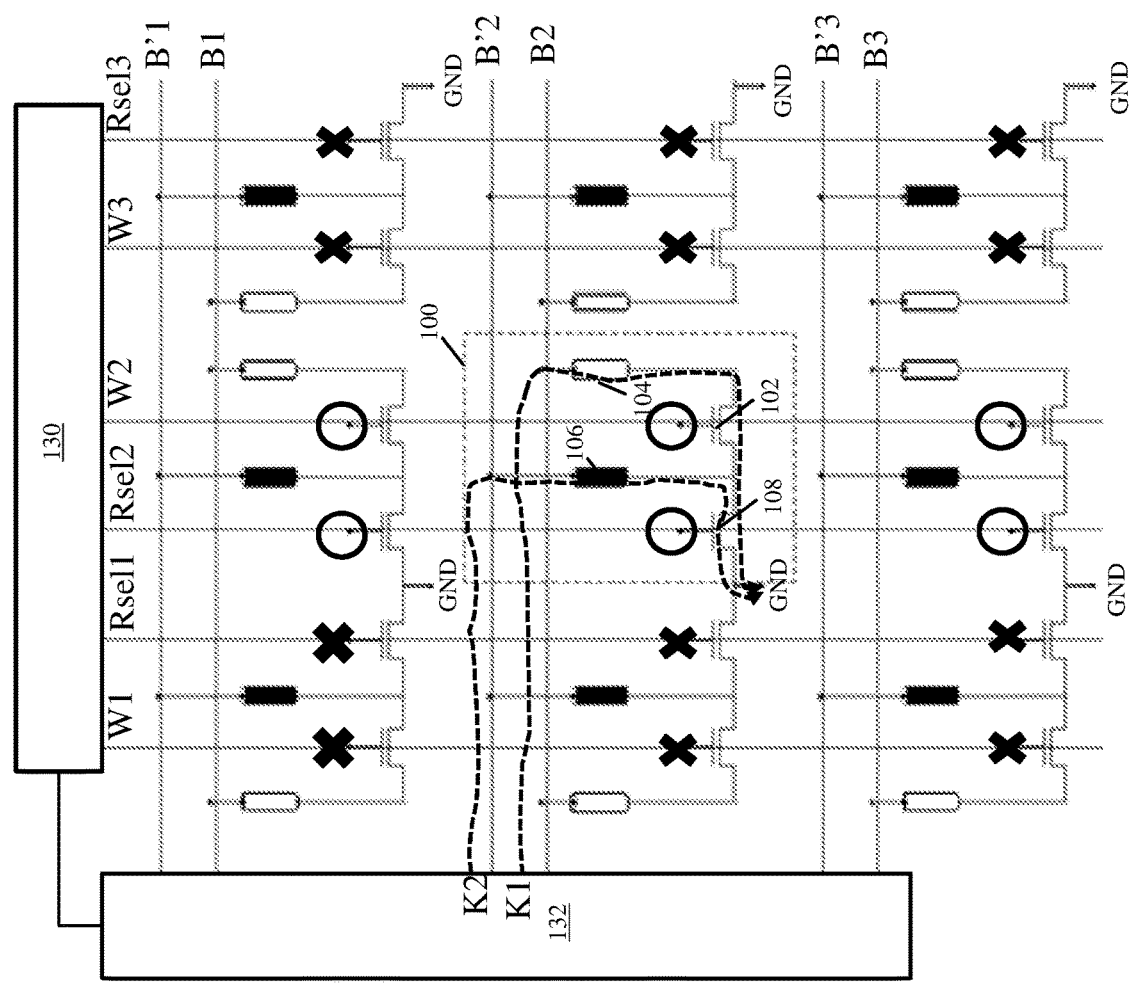
FIG. 4 shows a schematic view of the memory circuit during a read operation according to embodiments of the disclosure.

FIG. 4 depicts a read operation being performed on one structure 100 of memory cell 120. To implement a read operation, current flow across drive transistor 102 may be enabled by applying a voltage to a word line (e.g., W2) and current flow across read transistor 108 may be enabled by applying a voltage to a select line (e.g., Rsel2). Thereafter, methods according to the disclosure may include applying a first read current K1 to one bit line (e.g., B2) and a second read current K2 to the other bit line of the same pair (e.g., B'2). In this case, the applied read currents K1, K2 may flow from current source 132 to ground through transistor(s) 102, 108 and one element 104, 106. The applied current may be significantly less than the amount of current for implementing a write operation (e.g., less than one μA) to prevent any alteration of data during the read operation. First read current K1 may flow through first element 104, and second read current K2 may flow through second element 106.

First and second read currents K1, K2 will produce respective voltage drops across elements 104, 106, respectively. One advantage to using resistive memory elements in structure 100 is that the voltage drop across each element 104, 106 will indicate its memory state, and hence the memory state of structure 100. In an example, an operator may measure a test voltage across elements 104, 106. A high test voltage (i.e., a voltage above a predetermined threshold) indicates a high resistance, and a low test voltage (i.e., a voltage below the predetermined threshold) indicates a low resistance. The measured test voltages may allow a user to determine which of the two elements is in a high resistive state and which of the two elements is in a low resistive state. The measured voltages thus may be converted into an indication of which element 104, 106 is set and which is reset. The set/reset state of the applicable pair of elements 104, 106 may thus indicate the binary digit stored in structure 100. In some embodiments, the memory state of structure(s) 100 undergoing a read operation may be determinable solely based on the measured test voltage across one element 104, 106 or both elements 104, 106.

Figure 5:
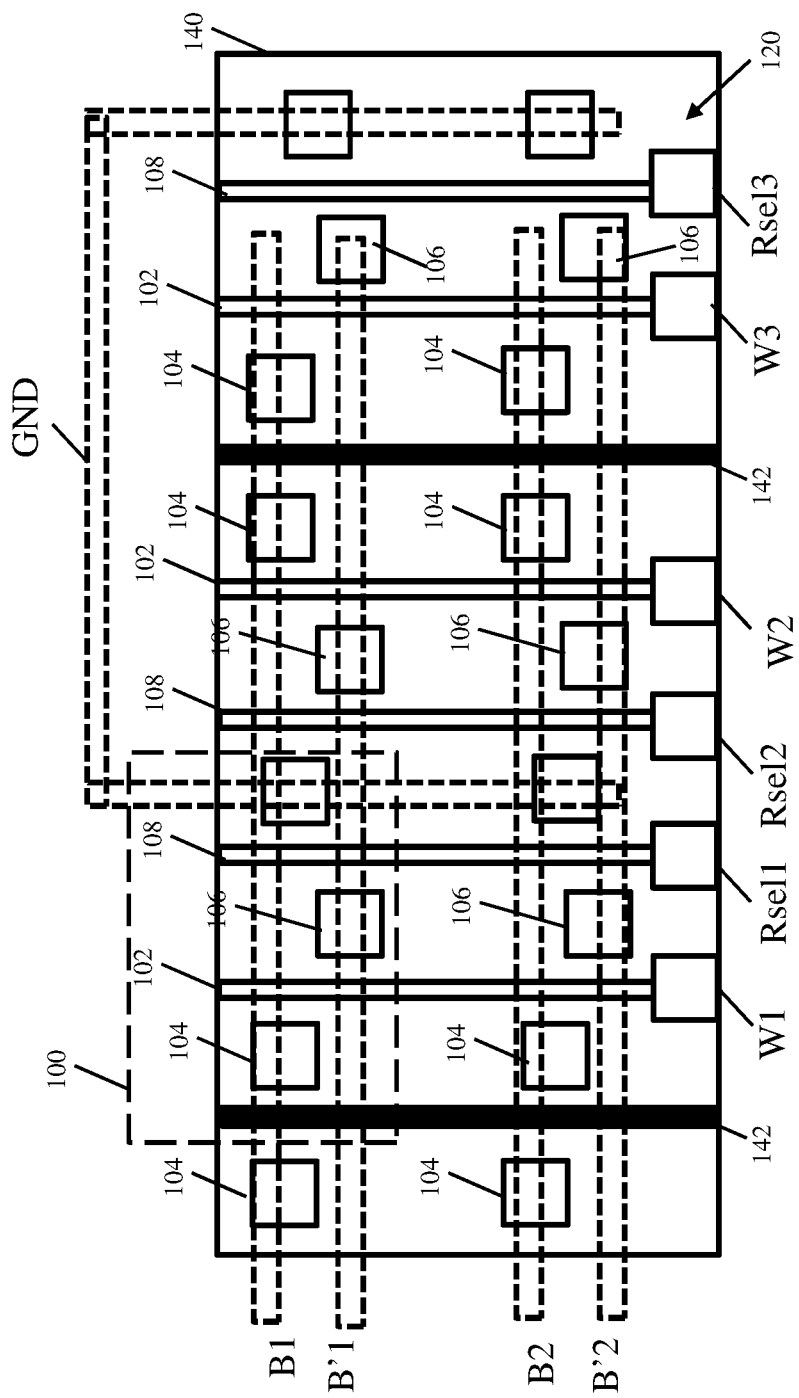
FIG. 5 shows a plan view of an integrated circuit (IC) layout including a circuit structure according to embodiments of the disclosure.

FIG. 5 depicts an embodiment of structure 100 and memory circuit 120 being implemented in an integrated circuit (IC) structure according to embodiments of the disclosure. Various structures in a depicted IC layer are shown with solid lines, while various elements located in vertically distal layers of the IC structure are shown in phantom. Various components of circuit structure 120, e.g., transistors 102, 108, elements 104, 106, etc., may be formed on or within a semiconductor substrate 140. Substrate 140 may include, e.g., one or more currently-known or later developed semiconductor substances generally used in semiconductor manufacturing, including without limitation: silicon (e.g., crystal silicon), germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Element(s) 104, 106 may be formed, e.g., by removing portions of substrate 104 and depositing conductive and resistive materials therein. According to an example, each element 104, 106 may be formed by depositing a layer of metal, followed by a dielectric layer, and then a layer of metal to form a vertically-oriented MIM resistor. Transistor(s) 102, 108 may be formed by forming active regions on or from portions of substrate 140, e.g., by doping, and forming contacts to the doped regions to yield transistor structures. Such transistors may take the form of, e.g., a planar transistor, fin-type field effect transistor (FinFET), vertical transistor, nanosheet transistor, etc. As shown, a single active semiconductor region may be used to form multiple transistors 102, 108 of the same type. To physically and electrically separate structures 100 and/or groups of structures 100 from each other, dielectric regions 142 may be formed on and/or within substrate 140 between selected adjacent structures 100. As shown in FIG. 5, overlying metal layers may be used to form the various bit lines (e.g., B1, B'1, B2, B'2), and connections to ground GND. Such overlying elements may be coupled to portions of memory circuit 120 using vertically-extending regions of conductive material, i.e., vias. Electrical couplings to each transistor of memory circuit 120 similarly may be provided through vertically-extending contacts to the gate of transistor(s) 102, 108.

Embodiments of the disclosure provide various technical and commercial advantages, some of which are described by example herein. The use of two complementary resistive memory elements (e.g., elements 104, 106) is different from past attempts at providing ReRAM for electronics, which have included only one resistive element. In conventional structures, the use of a single resistive memory element has caused technical challenges in distinguishing between write operations and read operations, and has posed a risk of inadvertently changing the data stored in a ReRAM cell. By contrast, the use of two complementary elements 104, 106 in embodiments of the disclosure assures no significant risk of accidental changes to data stored in memory circuit 120. The difference between memory states of each element 104, 106 may be significantly greater than the internal resistance of transistor(s) 102, 108, further reducing the risk of falsely reading or writing data in structure 100. The use of complementary elements 104, 106 will also maintain at least one element in a high resistive state, thereby preventing sudden spikes in current magnitude which otherwise arise from changing the resistance of a single resistive memory element. Embodiments of structure 100 with complementary elements 104, 106 thus may feature a self-limiting write current threshold. Embodiments of the disclosure are also operable at lower current magnitudes than ReRAM structures with a single memory element, and thus may be implemented in an IC structure with smaller via heights than may be needed in conventional ReRAM structures.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit structure comprising:
a drive transistor having a source terminal, a drain terminal, and a gate terminal coupled to a word line;
a first resistive memory element coupled between the source terminal of the drive transistor and a first bit line, wherein the first resistive memory element is in a first memory state;
a second resistive memory element coupled between the drain terminal of the drive transistor and a second bit line, wherein the second resistive memory element is in a second memory state opposite the first memory state; and
a read transistor having a source terminal coupled to the drain terminal of the drive transistor, a drain terminal coupled to ground, and a gate terminal coupled to a select line, wherein the first resistive memory element and the second resistive memory element comprise portions of a random access memory cell.

2. The circuit structure of claim 1, wherein an internal resistance of the read transistor is less than a resistance differential between the first and second memory states.

3. The circuit structure of claim 1, wherein an electrical resistance of the second resistive memory element in the second memory state is at least approximately one-thousand times greater than an electrical resistance of the first resistive memory element in the first memory state.

4. The circuit structure of claim 3, wherein the electrical resistance of the second resistive memory element in the second memory state is at least approximately one-hundred times greater than an internal resistance of the read transistor.

5. The circuit structure of claim 1, further comprising a control circuit electrically coupled to the gate terminal of the drive transistor, wherein the control circuit enables current flow across the drive transistor and disables current flow across the read transistor during a write operation, and enables current flow across the drive transistor and the read transistor during a read operation.

6. The circuit structure of claim 5, further comprising a current source coupled to the first bit line and the second bit line, wherein the current source transmits a current sufficient to perform a write operation.

7. A memory circuit, comprising:
a control circuit coupled to a plurality of word lines and a plurality of select lines; and
a plurality of memory cells each coupled to one of the plurality of word lines and one of the plurality of select lines, wherein each of the plurality of memory cells includes:
a drive transistor having a source terminal, a drain terminal, and a gate terminal coupled to one of the plurality of word lines,
a first resistive memory element coupled between the source terminal of the drive transistor and a first bit line, wherein the first resistive memory element is in a first memory state;
a second resistive memory element coupled between the drain terminal of the drive transistor and a second bit line, wherein the second resistive memory element is in a second memory state opposite the first memory state, and
a read transistor having a source terminal coupled to the drain terminal of the drive transistor, a drain terminal coupled to ground, and a gate terminal coupled to one of the plurality of select lines.

8. The memory circuit of claim 7, wherein the control circuit is configured to perform actions including:
disabling current flow across the read transistor of one of the plurality of energy cells; and
enabling current flow across the drive transistor of one of the plurality of memory cells, such that a current flows from the first bit line to the second bit line through the first resistive memory element, the drive transistor, and the second resistive memory element.

9. The memory circuit of claim 8, wherein the current flow is sufficient to perform a write or read operation for the first and second resistive memory elements.

10. The memory circuit of claim 7, wherein the control circuit is configured to perform actions including:
enabling current flow across the drive transistor of one of the plurality of energy cells; and enabling current flow across the read transistor of one of the plurality of memory cells, such that a first current flows from the first bit line to ground through the first resistive memory element and the read transistor, and a second current flows from the second bit line to ground through the second resistive memory element, the drive transistor, and the read transistor.

11. The memory circuit of claim 7, wherein an electrical resistance of the second resistive memory element in the second memory state is at least approximately one-thousand times greater than an electrical resistance of the first resistive memory element in the first memory state.

12. The memory circuit of claim 7, wherein the first resistive memory element of each of the plurality of memory cells and the second resistive memory element of each of the plurality of memory cells are selectable between a first memory state having a first resistance, and a second memory state having a second resistance, wherein the second resistance is at least approximately one-thousand times greater than the first resistance.

13. The memory circuit of claim 12, wherein the second resistance is at least approximately one-hundred times greater than an internal resistance of the read transistor.

14. A method for storing electronic data, the method comprising:
provide a structure comprising:
a drive transistor having a source terminal, a drain terminal, and a gate terminal coupled to a word line,
a first resistive memory element coupled between the source terminal of the drive transistor and a first bit line, wherein the first resistive memory element is in a first memory state;
a second resistive memory element coupled between the drain terminal of the drive transistor and a second bit line, wherein the second resistive memory element is in a second memory state opposite the first memory state; and
a read transistor having a source terminal coupled to the drain terminal of the drive transistor, a drain terminal coupled to ground, and a gate terminal coupled to a select line;
disabling current flow across the read transistor;
enabling current flow across the drive transistor; and
transmitting a write current from the first bit line to the second bit line through the first resistive memory element, the drive transistor, and the second resistive memory element, wherein transmitting the write current causes the first resistive memory element to switch to the second memory state, and causes the second memory element to switch to the first memory state.

15. The method of claim 14, further comprising, after transmitting the write current:
enabling current flow across the drive transistor;
transmitting a read current from the first bit line to ground through the first resistive memory element and the read transistor to induce a first test voltage across the first resistive memory element; and
transmitting the read current from the second bit line to ground through the second resistive memory element, the drive transistor, and the read transistor to induce a second test voltage across the second resistive memory element.

16. The method of claim 15, further comprising determining the memory state of the first resistive memory element and the memory state of the second resistive memory element, based on the first test voltage or the second test voltage.

17. The method of claim 14, wherein the write current is between approximately one microampere ($\mu A$) and approximately ten $\mu A$.

18. The method of claim 14, further comprising disabling a current flow through at least one additional memory cell coupled to the word line, before transmitting the write current.

19. The method of claim 14, further comprising, before disabling current flow across the read transistor:
enabling current flow across the read transistor;
disabling current flow across the write transistor; and
applying a voltage to the second resistive memory element through the second bit line without applying the voltage to the first resistive memory element through the first bit line, wherein applying the voltage causes the memory state of the second resistive memory element to be opposite the memory state of the first resistive memory element.

* * * * *